(12) United States Patent
Wolf et al.

(10) Patent No.: US 6,762,707 B2
(45) Date of Patent: Jul. 13, 2004

(54) PROGRAMMABLE ARCHITECTURE ANALOG-TO-DIGITAL CONVERTER

(75) Inventors: Thomas L. Wolf, Salt Lake City, UT (US); David Blaine, Holladay, UT (US); Rex K. Hales, Salt Lake City, UT (US); Marshall A. Soares, Taylorsville, UT (US)

(73) Assignee: Slicex, Salt Lake City, UT (US)

( * ) Notice: Subject to any disclaimer, the term of this patent is extended or adjusted under 35 U.S.C. 154(b) by 0 days.

(21) Appl. No.: 10/327,845

(22) Filed: Dec. 23, 2002

(65) Prior Publication Data

US 2003/0164786 A1 Sep. 4, 2003

Related U.S. Application Data

(60) Provisional application No. 60/343,090, filed on Dec. 21, 2001.

(51) Int. Cl.[7] ................................................. H03N 1/12

(52) U.S. Cl. ..................................................... 341/155
(58) Field of Search ......................................... 341/155

(56) References Cited

U.S. PATENT DOCUMENTS

| | | | | |
|---|---|---|---|---|
| 5,107,146 A | * | 4/1992 | El-Ayat ........................ 326/41 |
| 5,748,133 A | * | 5/1998 | Distinti ........................ 341/161 |
| 5,877,720 A | * | 3/1999 | Setty et al. ................... 341/159 |
| 2002/0105451 A1 | * | 8/2002 | Gulati et al. ................. 341/144 |

* cited by examiner

Primary Examiner—Howard L. Williams
(74) Attorney, Agent, or Firm—Steven L. Nichols; Rader, Fishman & Grauer PLLC

(57) ABSTRACT

A method and system by which multiple ADC architectures can be emulated comprises, a number of electrical components commonly used in a variety of ADC architectures, routing an analog input through a number of switches, and selectively connecting and disconnecting the switches to emulate one of multiple possible ADC architectures.

21 Claims, 7 Drawing Sheets

PROGRAMMABLE ARCHITECTURE ANALOG-TO-DIGITAL CONVERTER

RELATED APPLICATIONS

This application claims priority under 35 U.S.C. § 119(e) from previously-filed provisional patent application No. 60/343,090, filed Dec. 21, 2001, entitled "Programmable Architecture ADC [Analog-to-Digital Converter]" which is incorporated herein by reference in its entirety.

TECHNICAL FIELD

The present invention relates to the field of converting analog signals to digital signals. More specifically, the present invention relates to highly flexible devices used to convert an analog signal into a digital representation.

BACKGROUND

Analog-to-Digital converters or ADC's are used in a wide variety of electronic applications including, but not limited to, communications, imaging, measurement, control systems, sensors, etc. In general, ADC's may be used in any application in which it is desirable for an analog signal, i.e., a continuous electrical signal, to be digitally processed.

The converting of an analog signal to its digital counterpart is accomplished by repeatedly sampling a continuous analog signal, i.e., checking the voltage level at a fixed time, and outputting a digital approximation of each sample. Accordingly, there are two basic parameters that define ADC performance: sample rate, i.e., how often samples of the analog signal are made, and accuracy, i.e., how close the digital approximation is to the analog signal for each sample.

The benefits of converting an analog signal to its digital representation include, but are not limited to, noise reduction and the ability to use computers and computing software to analyze and manipulate the signal, etc.

There are a variety of ADC architectures that may be used to convert an analog signal to its digital counterpart. Several well known ADC architectures include, Integrating, Oversampling, Successive Approximation, Hybrid Successive Approximation, Flash, and Pipeline architectures. The Integrating and Oversampling architectures provide low to medium sample rates with high accuracy. Successive Approximation and Hybrid Successive Approximation provide medium sample rates and medium accuracy. Flash and Pipeline architectures provide high sample rates and medium to low accuracy.

When implementing an ADC, the application normally determines which ADC architecture will be used. For example, while some applications may need high accuracy other architectures don't, but instead require high sample rate. As presently understood in the art, a tradeoff exists between sample rate and accuracy, i.e., the sample rate inversely affects the accuracy and vice versa.

Many product markets, whose products utilize ADC's, are highly competitive, e.g., semiconductor, communications, measurement equipment, etc. Therefore, the cost of and time requirement for implementing ADC's into an application plays an important role in determining which ADC architecture will be used.

In developing new electronic products and applications which use ADC's, there are often several stages of testing, production, troubleshooting, etc., during which changes are made to a product that may affect the ADC architecture being used. It is desirable to reduce the time and cost of changing from one ADC architecture to another as much as possible during this development process.

SUMMARY

In one of many possible embodiments, the present invention provides a method and system in which different ADC architectures can be realized through selectively connecting electronic components regularly used in a variety of ADC architectures.

Another embodiment of the present invention provides programmable connections between electronic components used in a variety of ADC architectures.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

All conventional ADCs have three common functions. These are reference, control and comparison functions. The difference between ADC architectures is primarily the quantity, type, and interconnection of these functions. The reference function provides a voltage reference that is compared with an analog input by the comparison function. The control function takes the output of the comparison function and uses it to determine a digital representation for the analog input.

The building blocks used to create the reference, control and comparison functions vary in specification and implementation, but can generally be broken down into summation, gain (which can be either greater or less than 1), scaling, comparator, and digital logic. Some type of digital to analog converter (DAC) is often used to provide the reference function.

The comparison function can be performed by a single comparator, which compares an input voltage to a reference voltage. If the input voltage is higher than the reference voltage the comparator outputs a high logic value, otherwise the comparator outputs a low logic value. Alternatively, multiple comparators may be used together to provide multiple logic outputs. Usually, multiple comparators are used to provide higher accuracy in estimating the analog input voltage level.

Figure 1:
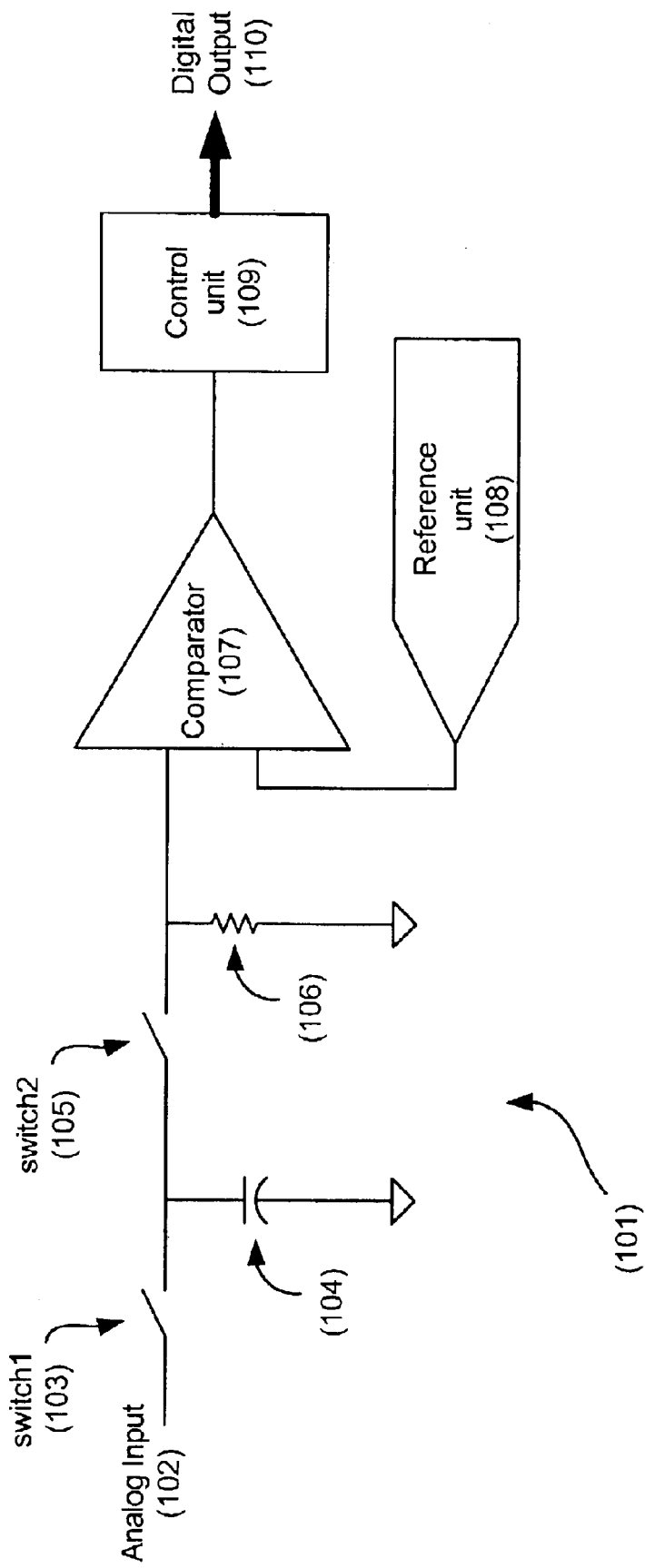
FIG. 1 is a simplified block diagram illustrating an embodiment of a standard dual slope, or Integrating, architecture ADC.

FIG. 1 is a simplified block diagram illustrating an embodiment of a standard dual slope, or Integrating, architecture ADC. As shown in FIG. 1, the dual slope ADC architecture (101) comprises an analog input (102), a first switch (103), a capacitor (104), a second switch (105), a resistor (106), a comparator (107), a reference unit (108), a control unit (109), and a digital output (110).

The capacitor (104) stores the value of the analog input (102) when first switch (103) is closed and second switch (105) is open. Alternatively, other analog storage elements may be used in place of the capacitor (104). After the capacitor (104) is charged to the value of the analog input (102), first switch (103) is opened and second switch (105) is closed. The stored voltage value on the capacitor (104) is then removed by a discharge element, such as a resistor (106).

The control unit (109) is a counter that counts time for as long it takes to remove the voltage value from the capacitor (104) until its value is the same or less than the reference value provided by reference unit (108). The accuracy of the digital output (110) depends on the frequency of the counter in the control unit (109) and the ability to measure the discharge of the capacitor (104).

For example, suppose the analog input (102) stored by the capacitor (104) is 2.625 volts, and it takes 100 microseconds for the capacitor (104) to discharge causing the comparator (107) to change value. If each count by the control unit (109) takes 20 microseconds and is approximated to equal 0.5 volts, 5 counts would occur before the voltage on the capacitor (104) is discharged, and the control unit (109) would produce a 2.5 volt digital output (110). The switches (103, 105) are then reversed, charging the capacitor (104) to the voltage level of the analog input (102), and the process is repeated.

Figure 2:
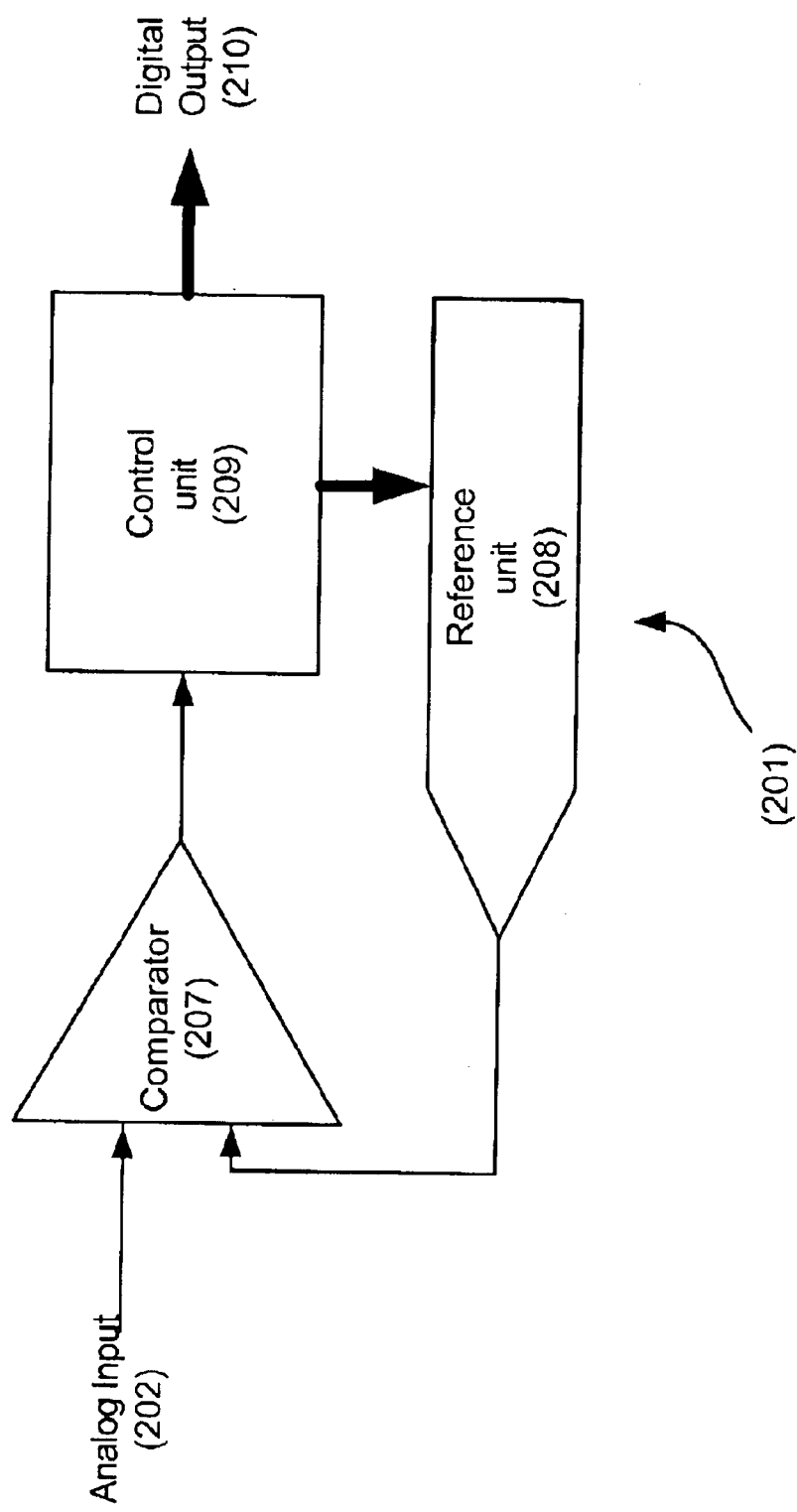
FIG. 2 is a simplified block diagram illustrating an embodiment of a Successive Approximation Register (SAR) architecture ADC.

FIG. 2 is a simplified block diagram illustrating an embodiment of a Successive Approximation Register (SAR) architecture ADC. As shown in FIG. 2, an SAR architecture (201) generally uses a single comparator (207) to determine if the analog input voltage (202) is higher or lower than the reference value provided by the reference unit (208). The output of the comparator (207) goes to the control unit (209) which changes the voltage value provided the reference unit (208). In a common embodiment, the reference unit (208) is a digital-to-analog converter, or DAC. The reference unit (208) provides a digital to analog conversion that is changed by the control unit (209) to a value that is either smaller or larger than the current value depending on the output of the comparator (207). This is typically done in a binary search pattern, i.e., an approximation process intended to minimize the number of cycles required.

As an example of the operation of the SAR architecture and binary search pattern, suppose the analog input (202) is 2.625 volts and the reference voltage provided by the reference unit (208) is 1.0 volt. The comparator (207) would output a high logic value to the control unit (209), which then increases the reference value of the reference unit (108) by, for example, 2.0 volts, resulting in a new reference value of 3.0 volts. Since 2.625 volts is less than the 3.0 volt reference, the comparator (107) would output a logic low, causing the control unit (209) to lower the reference voltage of the reference unit (108).

Using this binary search pattern, the change in voltage level is divided in half once the range of the analog input (202) has been determined. In the example above, the SAR unit (201) now knows that the voltage level is between 1.0 volt (the original reference voltage) and 3.0 volts (the most recent voltage). Therefore, if the control unit (109) uses a binary search pattern, the voltage level for the reference unit (108) is centered between 1.0 volts and 3.0 volts, i.e., the reference voltage level becomes 2.0 volts.

Since 2.625 volts is greater than 2.0 volts, the comparator (107) outputs a logic high, and the control unit (109) knows that the analog input (202) is between 2.0 and 3.0 volts. Therefore, using the binary search pattern, the control unit (109) again divides the possible voltage range in half by forcing the reference voltage up to 2.5 volts. The process would then be repeated (depending on the number of iterations), and the control unit (109) provides a digital output (210). SAR architectures (201) may use, for example, 2, 4, or 8 iterations (depending on the level of accuracy desired) to approximate each analog input (202) sample.

Figure 3:
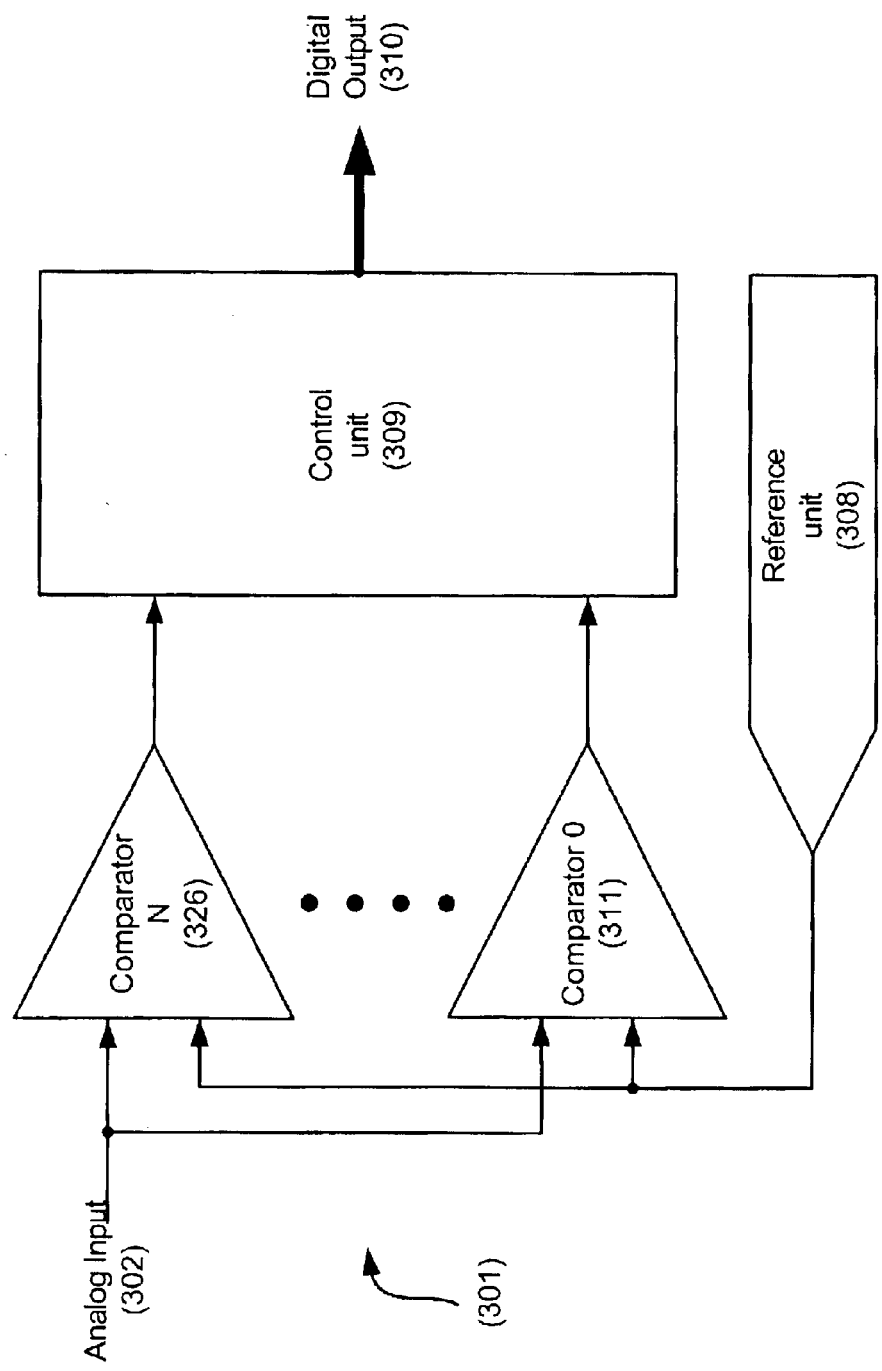
FIG. 3 is a simplified block diagram illustrating an embodiment of a Flash architecture ADC.

FIG. 3 is a simplified block diagram illustrating an embodiment of a Flash architecture ADC. As shown in FIG. 3, a Flash ADC (301) uses a number of comparators, e.g., comparator N (326) though comparator O (311). Typical $2^n$ comparators are used, where n is the number of output bits that define a digital output. Each comparator is connected to analog signal input (302) and a reference voltage. The reference unit (308) provides a different reference voltage for each comparator (311–326) creating different voltage levels. For example, a voltage source connected to a series of resistors may be used to provide a number of voltage references used by the comparators (311–326). The outputs of the comparators (311–326) are sent to the control unit (309), which interprets the comparator outputs (311–319) as a voltage level. The control unit (309), then provide an equivalent digital output (310).

For example, if the analog input is 2.625 volts, and the Flash ADC (301) uses 16 comparators (311–326) to convert an analog input (302) between 0.0 volts to 4.0 volts to a digital output (310), 16 voltage levels between 0.0 and 4.0 volts, e.g., 0.25, 0.5, 0.75, 1.0, 1.25, etc., maybe used as digital outputs (310). In this embodiment, the Flash ADC (301) would provide a digital output of 2.5 or 2.75 volts to approximate the 2.625 analog input (302).

Figure 4:
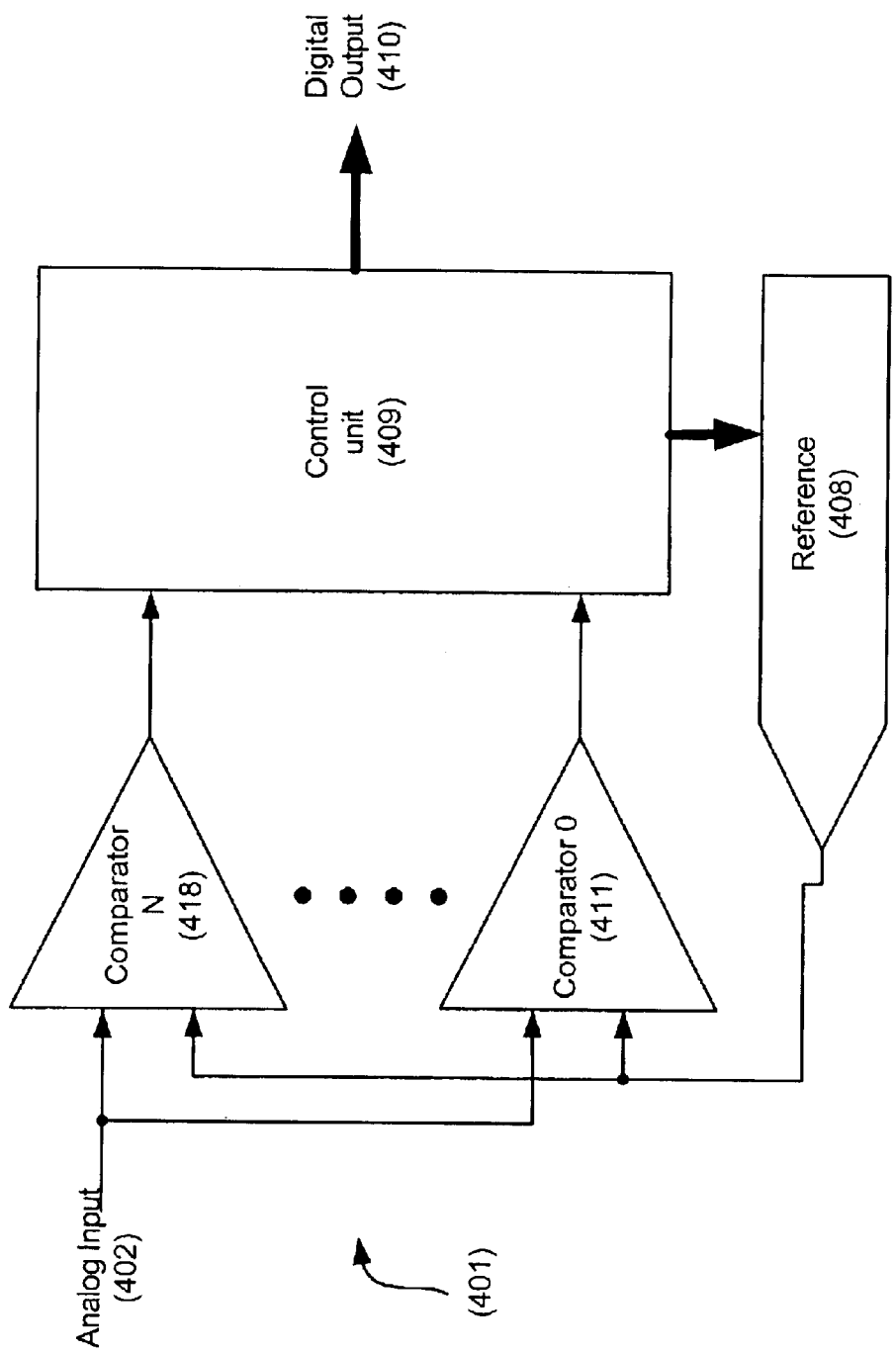
FIG. 4 is a simplified block diagram illustrating an embodiment of a Half-Flash architecture ADC.

FIG. 4 is a simplified block diagram illustrating an embodiment of a Half-Flash architecture ADC. As shown in FIG. 4, the Half-Flash architecture (401) is similar to both the SAR (201, FIG. 2) and Flash (301, FIG. 3) ADC architectures. More specifically, the Half-Flash architecture (401) uses a Flash (301, FIG. 3) ADC with $2^{(n-1)}$ comparators (411–418). On the first cycle the control unit (409) receives the value for the n/2 most significant bits provided by the comparators (411–418) and then changes the reference unit (408) output values to capture the n/2 least significant bits in the second cycle. In other words, a Half-Flash ADC (401) uses half as many comparators (411–418) as a Flash ADC (301, FIG. 3) and provides the same accuracy by dividing the voltage range covered by the reference unit (408) into two clock cycles.

Figure 5:
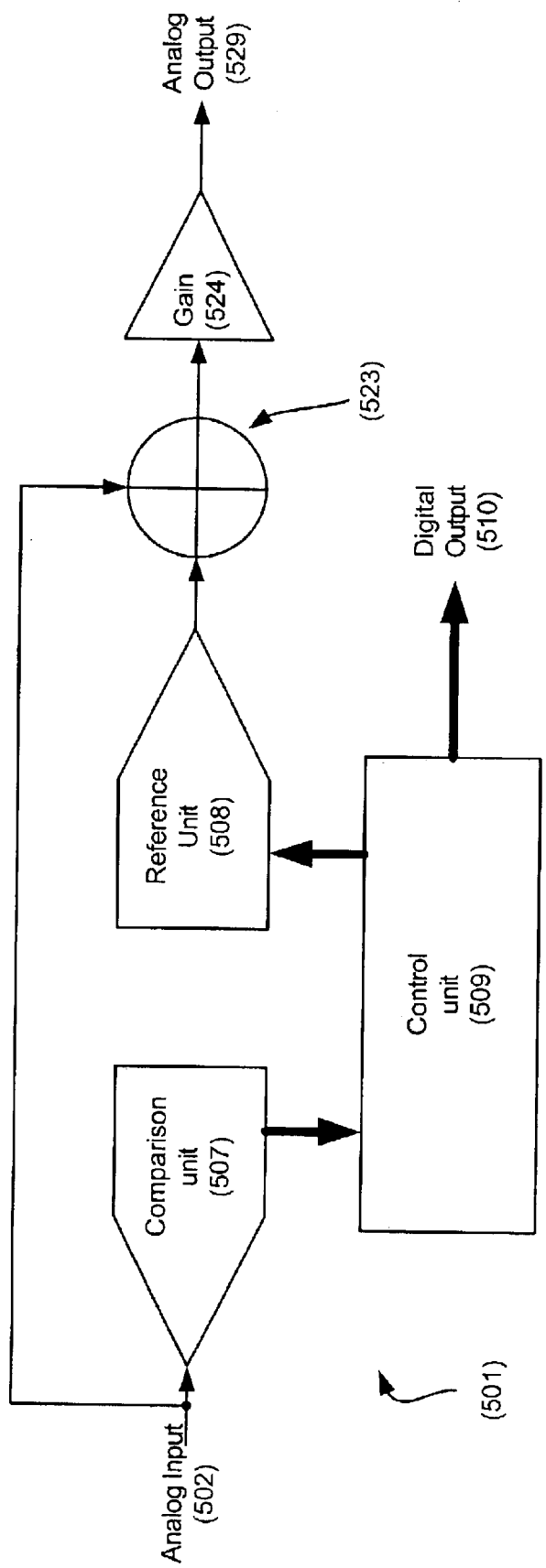
FIG. 5 is a simplified block diagram illustrating an embodiment of a Pipeline architecture ADC.

FIG. 5 is a simplified block diagram illustrating an embodiment of a Pipeline architecture ADC. As shown in FIG. 5, the Pipelined ADC architecture (501) is similar to the Half-Flash architecture (401, FIG. 4) except that rather than use the same reference and comparison functions, several stages of reference and comparison functions are used. The analog input (502) is input into a first comparison unit (507) which is preferably a Flash ADC (301, FIG. 3). The output of the comparison unit (507) is fed into a control unit (509) which forwards the value to a reference unit (508). The value of analog input (502) is fed forward into a summation function (523) and subtracted from the output of the reference unit (508). A gain unit (524) is then used to rescale the result. In a common embodiment, an operational amplifier is used as a gain unit (524).

The analog output (529) is then connected to a second stage Pipeline ADC (501) which is preferably identical in function and circuitry to the first stage Pipeline ADC (501). The digital outputs (510) of each stage are combined to provide the digital conversion value, with the first stage providing the most significant bits, etc. This method is analogous to cascading several Half-Flash ADC converters (401, FIG. 4). The control unit (509) takes care of the timing between stages and is often used to perform error detection and correction.

Figure 6:
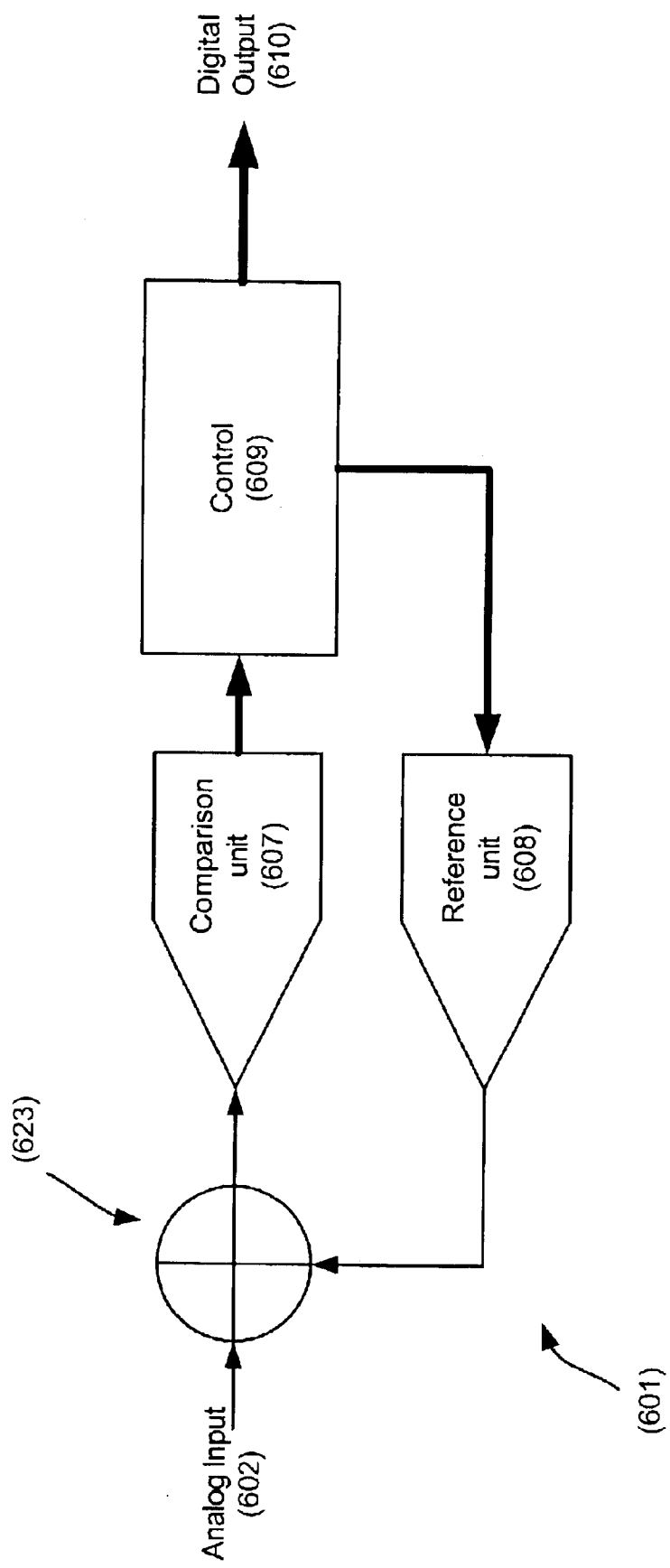
FIG. 6 is a simplified block diagram illustrating an embodiment of an Oversampling architecture ADC, called Sigma Delta (or Delta Sigma).

FIG. 6 is a simplified block diagram illustrating an embodiment of an Oversampling architecture ADC, called Sigma Delta (or Delta Sigma). As shown in FIG. 6, the Sigma Delta ADC (601) takes the analog input (602) and subtracts a feedback signal in the summation unit (623). The combined signal from the summation unit (623) is input to the comparison unit (607). The comparison unit (607) can be composed of a single comparator, or another type of ADC. A common embodiment uses a Flash (301, FIG. 3) converter. The output of the comparison unit (607) is sent to a control unit (609). The control unit (609) provides an appropriate digital input to the reference unit (608) which feeds back a value which is added to the analog input (603) and compared again. The Sigma Delta ADC (601) gains accuracy by over sampling the analog input signal (602) and using digital filtering in the control unit (609) to determine the digital output (610).

Figure 7:
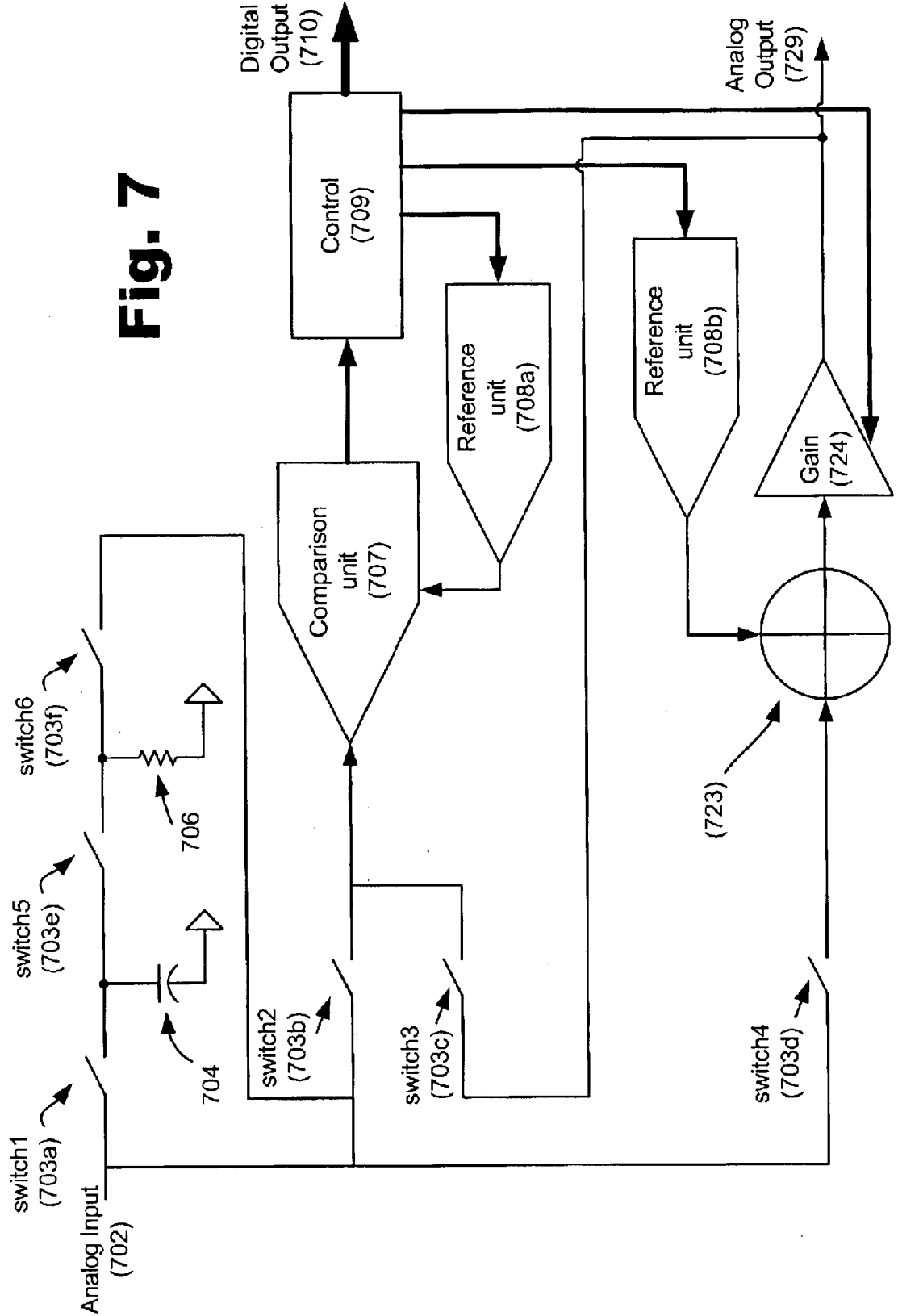
FIG. 7 is a simplified block diagram illustrating a programmable architecture ADC according to one embodiment of the present invention.

The preceding embodiments of common ADC architectures have been presented to understand the present invention as described in FIG. 7. FIG. 7 is a simplified block diagram illustrating a programmable architecture ADC (701) according to one embodiment of the present invention. As shown in FIG. 7, a number of switches (703b, 703c, 703d, and 703f) are used to selectively route the analog input (702).

A comparison unit (707) is preferably provided by a Flash ADC (301, Fig. 3) converter. There are two reference units (708a, 708b). A first reference unit (708a) provides multiple references needed by the comparison unit (707). This reference unit (708a) differs from other reference units illustrated above, e.g., the reference unit (508, FIG. 5) used with a Pipeline ADC (501, FIG. 5), in that its output values are controlled by the control unit (709), rather than being fixed as illustrated in FIG. 5.

A summation unit (723) subtracts its input from the other reference unit (708b), and the gain unit (724) scales the output of the summation unit (723) appropriately with a value provided by the control unit (709).

To provide a Dual Slope type ADC (101, FIG. 1), a sixth switch (703f) is closed, while a second switch (703b), third switch (703c), and fourth switch (703d) are opened. The control unit (709) sets the value of a first reference unit (708a) to a fixed value, which then functions as a Dual Slope ADC (101, FIG. 1) reference unit (108, FIG. 1). First switch (703a) and second switch (703b) function as first switch (103, FIG. 1) and second switch (105, FIG. 1) in the Dual Slope ADC (101, FIG. 1) architecture. A storage element is used to hold the value of the analog input (702), in a preferred embodiment a capacitor (704) is used. A discharge element may then be used to discharge the capacitor (704). In a preferred embodiment a resistor (706) is used as the discharge element. Together, the storage and discharge elements may be referred to as a sampling circuit. A comparison unit (707) and control unit (709) function accordingly as described above for FIG. 1 to provide a digital output (710).

To provide a Successive Approximation type ADC (201, FIG. 2), second switch (703b) is closed while first switch (703a), third switch (703c), fourth switch (703d), and fifth switch (703f) are open. The comparison unit (707), control unit (709), and first reference unit (708a) function as would the SAR's (201, FIG. 2) comparison unit (207, FIG. 2), control unit (209, FIG. 2), and reference unit (208, FIG. 2) as described above.

To provide a Flash type ADC (301, FIG. 3), second switch (703b) is closed while first switch (703a), third switch (703c), fourth switch (703d), and sixth switch (703f) are open. The comparison unit (707), functions as the comparators (311–326, FIG. 3) shown in FIG. 3. The control unit (709) and reference unit (708) function as described above for FIG. 3.

To provide a Half-Flash ADC, second switch (703b) is closed while first switch (703a), third switch (703c), fourth switch (703d), and sixth switch (703f) are opened. The comparison unit (707), functions as the comparators (411–418, FIG. 4) described in FIG. 4. The control unit (709) and reference unit (708) function as described above in connection with FIG. 4.

To provide a Pipelined ADC, second switch (703b), and fourth switch (703d) are closed, while first switch (703a), third switch (703c), and sixth switch (703f) are opened. The comparison unit (707), functions as comparison unit (507, FIG. 5) described in FIG. 5. The control unit (709) functions as the control unit (509, FIG. 5) described in FIG. 5. The second reference unit (708b) functions as the reference unit (508, FIG. 5) described in FIG. 5. In particular, the control unit (709) sets the reference unit (708b) to a fixed value. The summation unit (723), functions as summation unit (523, FIG. 5) described in FIG. 5. The gain unit (724) is set to a fixed value by the control unit (709) and functions as the gain unit (524, FIG. 5) described in FIG. 5. By cascading multiple programmable ADC's (701), in similar fashion as described for each Pipelined ADC stage (501, FIG. 1), a Pipelined ADC is realized.

To provide a Sigma Delta type ADC (601, FIG. 6), third switch (703c) and fourth switch (703d) are closed, while first switch (703a), second switch (703b), and sixth switch (7030 are open. The control unit (709) sets the first reference unit (708a) to a fixed value. The gain unit (724) is set to a fixed value of 1 by the control unit (709). The summation unit (723) then functions as summation unit (623, FIG. 6) described in FIG. 6. The comparison unit (707) functions as the comparison unit (608, FIG. 6) described in FIG. 6. The second reference unit (708b) functions as reference unit (608) described in FIG. 6. As with the Pipelined ADC, multiple programmable ADC's (701) can be cascaded to provide a higher order Sigma Delta ADC.

The preceding description has been presented only to illustrate and describe embodiments of invention. It is not intended to be exhaustive or to limit the invention to any precise form disclosed. Many modifications and variations are possible in light of the above teaching. It is intended that the scope of the invention be defined by the following claims.

What is claimed is:

1. A programmable Analog-to-Digital converter (ADC), said programmable ADC comprising:

a sampling circuit for sampling said analog input;

a comparison unit to compare an analog input to a reference voltage level;

a first reference unit for providing said reference voltage level to the comparison unit;

a summing unit for subtracting said analog input from a second reference voltage level;

a second reference unit for providing said second reference voltage level to the summing unit;

a control unit for controlling said reference units; and a circuit for selectively routing said analog input among said sampling circuit, comparison unit and summing unit to emulate a plurality of different types of ADCs.

2. The programmable ADC of claim 1, wherein said circuit for selectively routing comprises a plurality of switches.

3. The programmable ADC of claim 2, wherein said switches comprise six switches configured to allow said programmable ADC to emulate a plurality of ADC types.

4. The programmable ADC of claim 1, wherein said comparison unit comprises a comparator.

5. The programmable ADC of claim 1, wherein said reference units comprise a Digital-to-Analog (DAC) converter.

6. The programmable ADC of claim 5, wherein said plurality of ADC types comprises Dual Slope, Successive Approximation, Flash, Half-Flash, Sigma Delta, and Pipelined ADCs.

7. A programmable Analog-to-Digital converter (ADC). said programmable ADC comprising:
   a sampling circuit for sampling said analog input;
   a comparison unit to compare an analog input to a reference voltage level;
   a first reference unit for providing said reference voltage level to the comparison unit;
   a summing unit;
   a second reference unit for providing a second reference voltage level to the summing unit;
   a control unit for controlling said reference units; and
   a circuit for selectively routine said analog input among said sampling circuit, comparison unit and summing unit to emulate a plurality of different types of ADCs;
   wherein said comparison unit comprises a Flash ADC.

8. The programmable ADC of claim 7, wherein said circuit for selectively routing comprises a plurality of switches.

9. The programmable ADC of claim 7, wherein said reference units comprise a voltage source connected to a series of resistors.

10. The programmable ADC of claim 7, wherein said reference units comprise a Digital-to-Analog (DAC) converter.

11. A programmable Analog-to-Digital converter (ADC), said programmable ADC comprising:
    a sampling circuit for sampling said analog input;
    a comparison unit to compare an analog input to a reference voltage level;
    a first reference unit for providing said reference voltage level to the comparison unit;
    a summing unit;
    a second reference unit for providing a second reference voltage level to the summing unit;
    a control unit for controlling said reference units; and
    a circuit for selectively routing said analog input among said sampling circuit, comparison unit and summing unit to emulate a plurality of different types of ADCs;
    wherein said reference units comprise a voltage source connected to a series of resistors.

12. The programmable ADC of claim 11, wherein said circuit for selectively routing comprises a plurality of switches.

13. The programmable ADC of claim 12, wherein said switches comprise six switches configured to allow said programmable ADC to emulate a plurality of ADC types.

14. The programmable ADC of claim 11, wherein said reference units comprise a Digital-to-Analog (DAC) converter.

15. The converter of claim 17, wherein said different ADC types comprise Dual Slope, Successive Approximation, Flash, Half-Flash, Sigma Delta, and Pipelined ADCs.

16. A programmable Analog-to-Digital converter (ADG), said programmable ADC comprising:
    a sampling circuit for sampling said analog input;
    a comparison unit to compare an analog input to a reference voltage level;
    a first reference unit for providing said reference voltage level to the comparison unit;
    a summing unit;
    a second reference unit for providing a second reference voltage level to the summing unit;
    a control unit for controlling said reference units; and
    a circuit for selectively routine said analog input among said sampling circuit, comparison unit and summing unit to emulate a plurality of different types of ADCs;
    wherein said control unit comprises a counter.

17. A single analog-to-digital converter (ADC) unit that combines a plurality of analog-to-digital converter (ADC) types so that different ADC types can be emulated by said single ADC unit, said converter comprising:
    a sampling circuit;
    a comparison unit;
    at least one reference unit for outputting a reference signal;
    a summing unit for subtracting an analog input from said reference signal ; and
    means for selectively applying said analog input to said sampling circuit, comparison unit and summing unit to selectively emulate said different ADC types.

18. The converter of claim 17, further comprising a first reference unit providing an input to said comparison unit and second reference unit providing an input to said summing unit.

19. The converter of claim 17, wherein said comparison unit comprises a comparator.

20. A single analog-to-digital converter (ADC) unit that combines a plurality of analog-to-digital converter (ADC) types so that different ADC types can be emulated by said single ADC unit, said converter comprising:
    a sampling circuit;
    a comparison unit;
    a summing unit; and
    means for selectively applying an analog input to said sampling circuit, comparison unit and summing unit to selectively emulate said different of ADC types;
    wherein said comparison unit comprises a Flash ADC converters.

21. A single analog-to-digital converter (ADC) unit that combines a plurality of analog-to-digital converter (ADC) types so that different ADC types can be emulated by said single ADC unit, said converter comprising:
    a sampling circuit;
    a comparison unit;
    a summing unit;
    means for selectively applying an analog input to said sampling circuit, comparison unit and summing unit to selectively emulate said different of ADC types; and
    a control unit for outputting a digital output based on said analog input;
    wherein said control unit comprises a counter.

* * * * *